United States Patent
Murayama

(10) Patent No.: US 9,633,964 B2
(45) Date of Patent: Apr. 25, 2017

(54) WIRING SUBSTRATE AND ELECTRONIC COMPONENT DEVICE

(71) Applicant: SHINKO ELECTRIC INDUSTRIES CO., LTD., Nagano-shi (JP)

(72) Inventor: Kei Murayama, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 0 days.

(21) Appl. No.: 15/012,017

(22) Filed: Feb. 1, 2016

(65) Prior Publication Data

US 2016/0276301 A1  Sep. 22, 2016

(30) Foreign Application Priority Data

Mar. 19, 2015 (JP) ................................ 2015-056214

(51) Int. Cl.
```
H01L 23/34    (2006.01)
H01L 23/00    (2006.01)
H01L 23/31    (2006.01)
H01L 23/498   (2006.01)
```

(52) U.S. Cl.
CPC .......... *H01L 24/16* (2013.01); *H01L 23/3142* (2013.01); *H01L 23/49822* (2013.01); *H01L 23/49827* (2013.01); *H01L 23/49838* (2013.01); *H01L 2224/16227* (2013.01); *H01L 2924/3841* (2013.01)

(58) Field of Classification Search
CPC .......... H01L 23/53238; H01L 23/5222; H01L 23/53295; H01L 21/7682; H01L 21/768
See application file for complete search history.

(56) References Cited

U.S. PATENT DOCUMENTS

| 5,136,365 A | 8/1992 | Pennisi | |
|---|---|---|---|
| 2009/0184424 A1* | 7/2009 | Furusawa | 257/758 |

FOREIGN PATENT DOCUMENTS

| JP | H04-262890 | 9/1992 |
|---|---|---|
| JP | 2008-78238 A1 | 4/2008 |

* cited by examiner

*Primary Examiner* — Hoa B Trinh
(74) *Attorney, Agent, or Firm* — Katz, Quintos & Hanson, LLP

(57) ABSTRACT

A wiring substrate includes a connection pad formed in the outermost wiring layer, a dummy pad formed in the outermost wiring layer, and a dummy wiring portion formed in the outermost wiring layer, the dummy wiring portion connecting the connection pad and the dummy pad. The maximum width of each of the connection pad and the dummy pad is set to be larger than the width of the dummy wiring portion. A bump of an electronic component is flip-chip connected to a connection pad through a resin-containing solder.

5 Claims, 8 Drawing Sheets

WIRING SUBSTRATE AND ELECTRONIC COMPONENT DEVICE

CROSS-REFERENCE TO RELATED APPLICATIONS

This application is based upon and claims the benefit of priority of the prior Japanese Patent Application No. 2015-056214, filed on Mar. 19, 2015, the entire contents of which are incorporated herein by reference.

FIELD

This invention is related to a wiring substrate and an electronic component device.

BACKGROUND ART

Heretofore, there is wiring substrates for mounting electronic components such as semiconductor chips. In such a wiring substrate, bumps of the semiconductor chip are flip-chip connected to connection pads of the wiring substrate through a solder.

A related art is disclosed in Japanese Laid-open Patent Publication No. 04-262890 and Japanese Laid-open Patent Publication No. 2008-78238.

SUMMARY

As will be explained in the preliminary matter section below, there is a method in which bumps of an electronic component are flip-chip connected to connection pads of a wiring substrate through a resin-containing solder. In this method, solder particles in the resin-containing solder are aggregated in the periphery of the bumps of the electronic component by performing a heat process, thereby a solder is formed.

However, the volume of the solder formed on each bump of the electronic component varies between plural bumps of the electronic component. For this reason, an electrical short circuit is easy to occur between the bumps of the electronic component.

According to one aspect discussed herein, there is provided a wiring substrate, including a connection pad formed in an outermost wiring layer, a dummy pad formed in the outermost wiring layer, and a dummy wiring portion formed in the outermost wiring layer, the dummy wiring portion connecting the connection pad and the dummy pad, wherein, a maximum width of each of the connection pad and the dummy pad is larger than a width of the dummy wiring portion.

Also, according to another aspect discussed herein, there is provided an electronic component device, including a wiring substrate including a connection pad formed in an outermost wiring layer, a dummy pad formed in the outermost wiring layer, and a dummy wiring portion formed in the outermost wiring layer, the dummy wiring portion connecting the connection pad and the dummy pad, an electronic component including a bump flip-chip connected to the connection pad of the wiring substrate, a solder formed on each of the bump of the electronic component, the connection pad, the dummy wiring portion and the dummy pad of the wiring substrate, and a sealing resin filled between the electronic component and the wiring substrate, wherein, a maximum width of the dummy pad is set to be larger than a width of the dummy wiring portion, and a volume of the solder on the dummy pad is larger than a volume of the solder on the dummy wiring portion.

Further, according to still another aspect discussed herein, there is provided a method of manufacturing an electronic component device, including preparing a wiring substrate including a connection pad, a dummy wiring portion linked to the connection pad, and a dummy pad linked to the dummy wiring portion, as an outermost wiring layer in an upper face of the wiring substrate, forming a resin-containing solder on the wiring substrate, and arranging a bump of an electronic component on the connection pad of the wiring substrate by pushing the bump of the electronic component into the resin-containing solder, and aggregating solder particles on each of the bump of the electronic component, the connection pad, the dummy wiring portion, and the dummy pad by a heat process, thereby forming a solder, wherein, a maximum width of each of the connection pad and the dummy pad is set to be larger than a width of the dummy wiring portion, and in the forming of the solder, the solder aggregated on the connection pad and the bump of the electronic component is made to flow toward the dummy pad side through the dummy wiring portion, thereby a volume of the solder formed on the bump of the electronic component is adjusted.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENT

Hereinbelow, an embodiment will be explained with reference to the accompanying drawings.

Prior to the explanation of the embodiment, the preliminary matter to be set forth as a basis will be explained hereunder. FIGS. 1A to 1E are views for explaining a problem which occurs when an electronic component is flip-chip connected to a wiring substrate through a resin-containing solder, according to the preliminary matter.

Figure 1A:
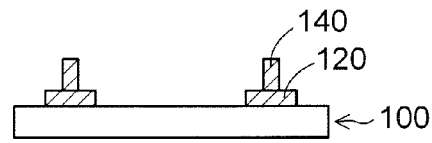
FIGS. 1A to 1E are cross-sectional views for explaining a problem which occurs when an electronic component is flip-chip connected to a wiring substrate through a resin-containing solder, according to a preliminary matter.
Figure 1B:
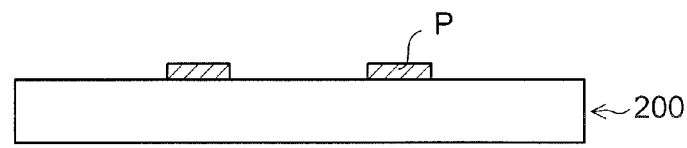

As depicted in FIG. 1A, first, an electronic component 100 in chip form is prepared. The electronic component 100 includes electrodes 120 and gold bumps 140 connected to the electrodes 120. Further, as depicted in FIG. 1B, a wiring substrate 200 including connection pads P on an upper face side is prepared.

Figure 1C:
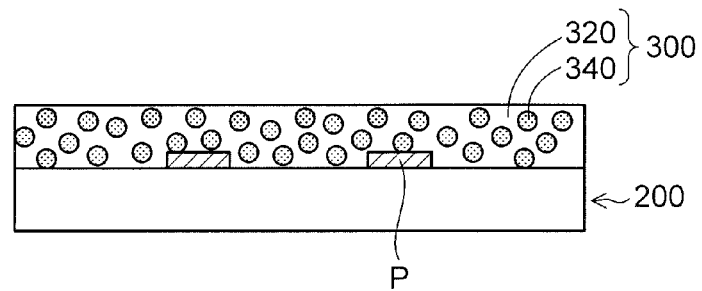

Then, as depicted in FIG. 1C, a resin-containing solder 300 is coated on the wiring substrate 200. The resin-containing solder 300 is formed by dispersing many solder particles 340 in thermosetting epoxy resin 320.

Figure 1D:
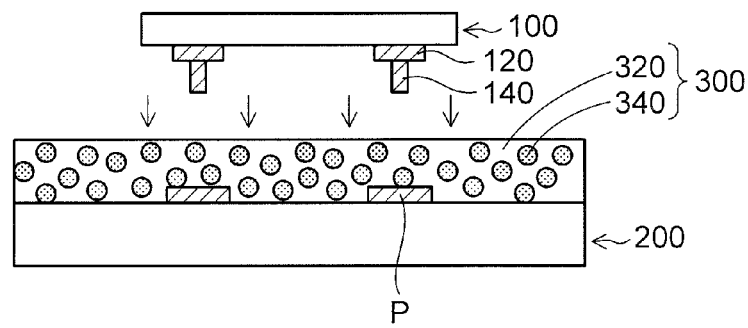

Thereafter, as depicted in FIG. 1D, the gold bumps 140 of the electronic component 100 in FIG. 1A are pushed into the resin-containing solder 300, thereby the gold bumps 140 are arranged on the connection pads P of the wiring substrate 200. Further, at the same time, the wiring substrate 200, the resin-containing solder 300, and the electronic component 100 are heated.

Figure 1E:
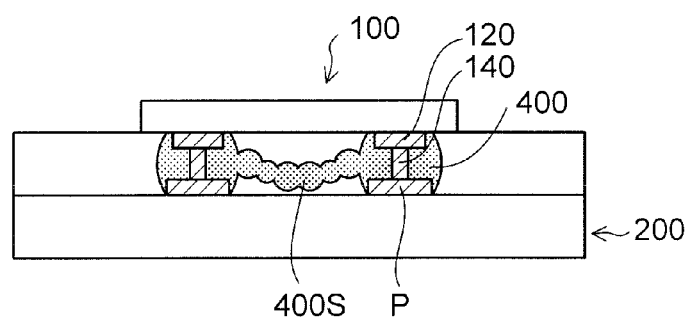

By this matter, as depicted in FIG. 1E, with fluidization of the epoxy resin 320 of the resin-containing solder 300, the solder particles 340 are aggregated on outer faces of the electrodes 120 and the gold bumps 140 of the electronic component 100 and outer faces of the connection pads P of the wiring substrate 200, thereby a solder 400 is formed.

At this time, in the case that the amount of solder particles 340 contained per unit volume in the resin-containing solder 300 and the total area of the connection pads P of the wiring substrate 200 are appropriate each other, the solder 400 is formed with appropriate volume from the connection pads P of the wiring substrate 200 to a periphery of the gold bumps 140 of the electronic component 100.

However, as depicted in FIG. 1E, in the case that the total area of the pads P of the wiring substrate 200 is small relative to the amount of solder particles 340 contained per unit volume in the resin-containing solder 300, excess solder particles 340 of the resin-containing solder 300 lose a place to go, and are aggregated in a region between the pads P, and are formed to be linked as excess solder 400S.

For this reason, there is a problem in which an electrical short circuit is easy to occur between the gold bumps 140 of the electronic component 100 due to the excess solder 400S.

As the solution of above problem, there is a way to provide dummy pads arranged independently to the connection pads as depicted in Patent Document 2. However, as the size of the connection pads decreases relative to the particle size of the solder particles, the variation in amount of the solder aggregated on the connection pads increases.

For this reason, there is still the problem in which the short circuit occurs at some positions, or the variation increases in the reliability of the connection with the electronic component and the electrical characteristics.

Also, the volume of the solder 400 formed on each gold bump 140 of the electronic component 100 is easy to be vary depending on the degree of the density of the pattern arrangement of the connection pads P of the wiring substrate 200, and it is difficult to control this variation. For this reason, an electrical short circuit is easy to occur in the periphery of the gold bump 140 of the electronic component 100 on which a large amount of solder is formed.

A wiring substrate of the embodiment to be explained below can solve the above problem.

Embodiment

Figure 2:
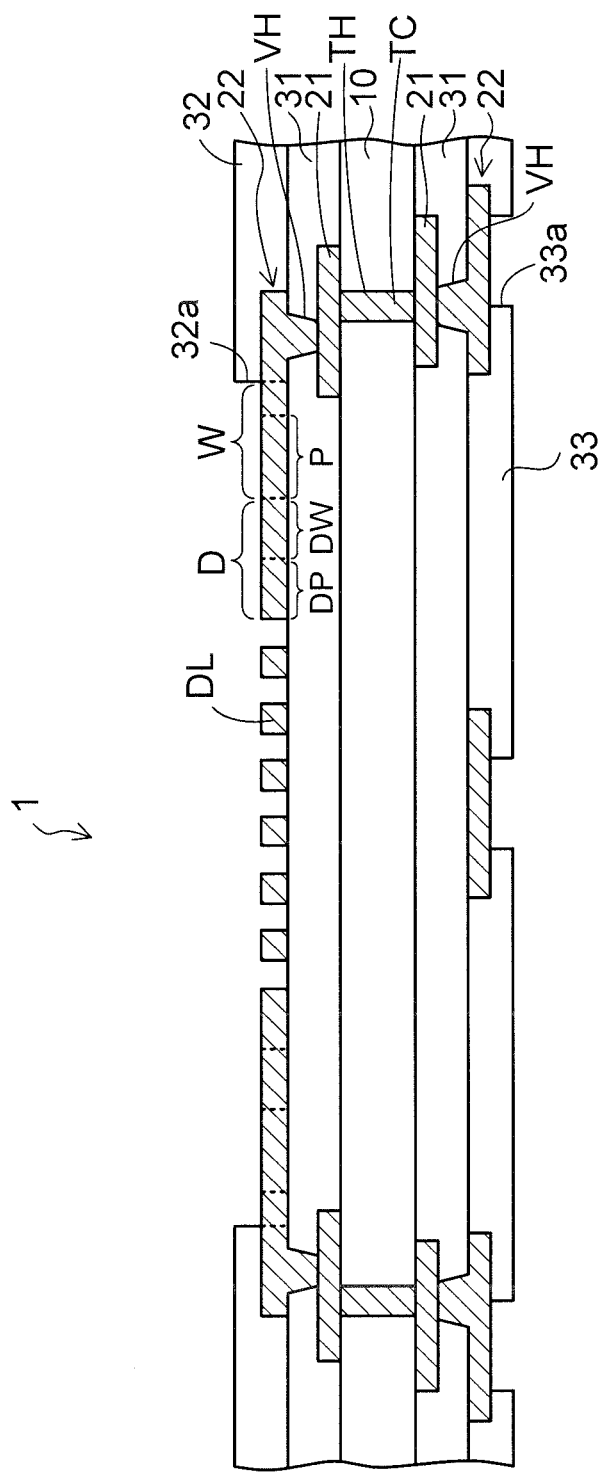
FIG. 2 is a cross-sectional view depicting a wiring substrate of an embodiment.
Figure 3:
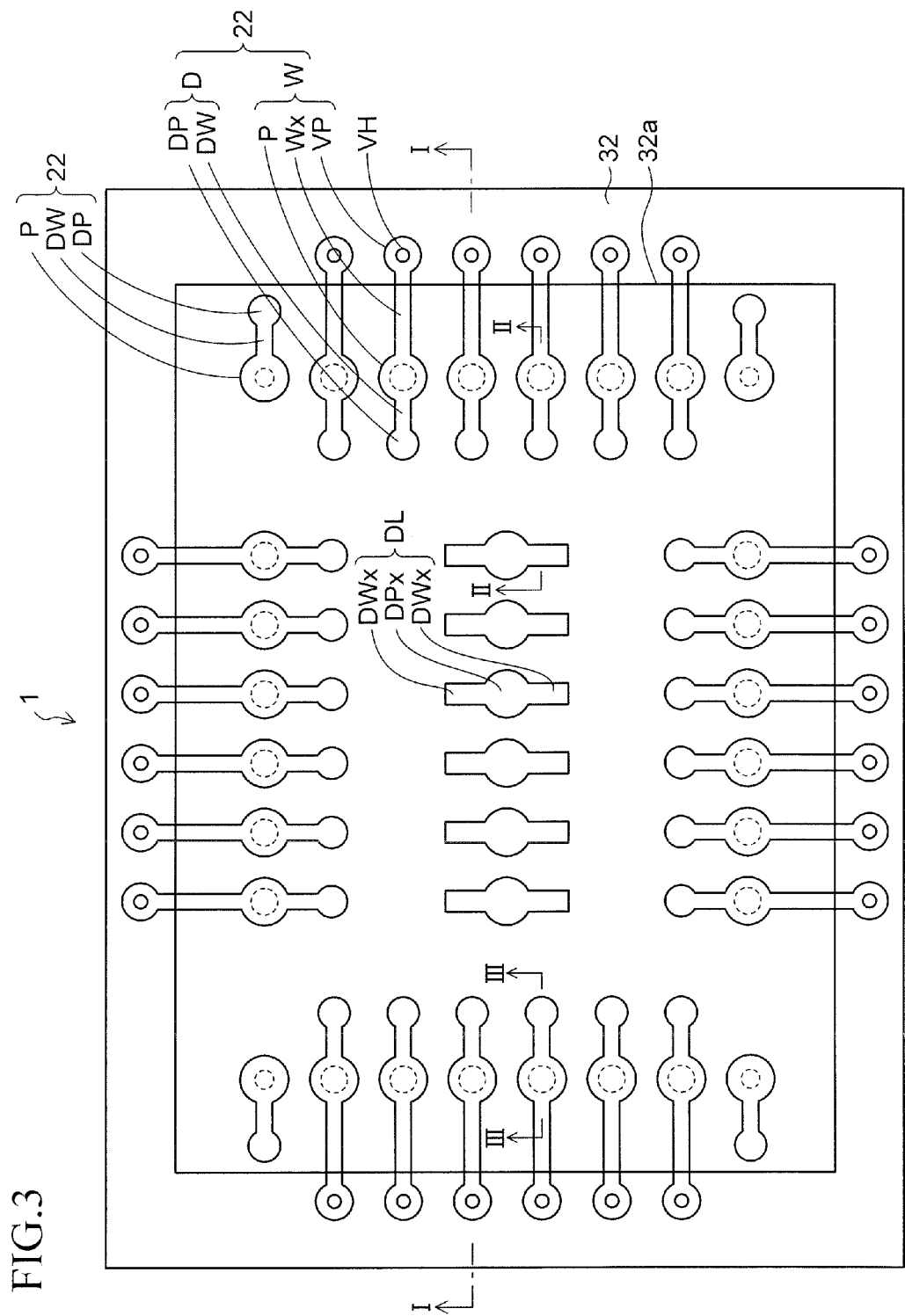
FIG. 3 is a plan view depicting the wiring substrate of the embodiment.

FIG. 2 and FIG. 3 are views depicting the wiring substrate of the embodiment. FIG. 4 to FIG. 7 are views for explaining a method of manufacturing an electronic component device of the embodiment. FIG. 8 is a view depicting an electronic component device of the embodiment.

As depicted in FIG. 2, a wiring substrate 1 of the embodiment includes a core substrate 10 formed of glass epoxy resin or the like in a center part of the thickness direction. Through-holes TH penetrating in the thickness direction are formed in the core substrate 10, and penetration conductors TC are filled in the through-holes TH.

Also, first wiring layers 21 are formed on both face sides of the core substrate 10 respectively. The first wiring layers 21 on both face sides are connected each other by the penetration conductors TC.

Alternatively, through-hole plating layers may be formed on sidewalls of the through-holes TH and resin bodies may be filled in the remaining hole parts of the through-holes TH. In this case, the first wiring layers 21 on both face sides are connected each other through the through-hole plating layers.

The first wiring layers 21 and the penetration conductors TC are formed of a wiring material such as copper, and the same applies to the other wiring layers.

Insulating layers 31 are formed on both face sides of the core substrate 10 respectively, and include via holes VH arranged on connection parts of the first wiring layers 21. The insulating layers 31 are formed of epoxy resin, polyimide resin, or the like.

Also, second wiring layers 22 are formed on the insulating layers 31 on both face sides respectively, and connected to the first wiring layers 21 through via conductors in the via holes VH.

A solder resist layer 32 is formed on the insulating layer 31 on the upper face side of the core substrate 10, and is provided with one opening portion 32a that a group of pads of the second wiring layers 22 are collectively exposed.

Also, a solder resist layer 33 is formed on the insulating layer 31 on the lower face side of the core substrate 10 and is provided with opening portions 33a on connection parts of the second wiring layers 22.

Next, the second wiring layers 22 on the upper face side of the core substrate 10 will be explained in detail with reference additionally to the plan view in FIG. 3. The cross-sectional view in FIG. 2 corresponds to a cross section taken along line I-I in the plan view in FIG. 3.

The plan view in FIG. 3 partially depicts a quadrangle chip mounting region on which one electronic component is mounted. In actual practice, a large-size substrate on which a plurality of chip mounting regions are defined may be employed.

As depicted in FIG. 3, in each of peripheral regions inside from the four sides of the chip mounting region, a plurality of second wiring layers 22 are arranged side by side to extend from an outer side to an inner side. The second wiring layers 22 are formed as the outermost wiring layers on the upper face side of the core substrate 10.

The second wiring layer 22 is formed of a wiring portion W and a dummy portion D linked to the wiring portion W and extending to the inner side. The wiring portion W is formed of a via pad VP linked to the via conductor in the via hole VH, a lead wiring portion Wx linked to the via pad VP, and a connection pad P linked to the lead wiring portion Wx.

On the other hand, the dummy portion D is formed of a dummy wiring portion DW linked to the connection pad P and a dummy pad DP linked to the dummy wiring portion DW. The connection pad P and the dummy pad DP are each formed in a circular shape.

In this way, the wiring substrate 1 of the embodiment includes the connection pad P formed in the outermost wiring layer, the dummy pad DP formed in the outermost wiring layer, and the dummy wiring portion DW formed in the outermost wiring layer and connecting the connection pad P and the dummy pad DP.

Then, the maximum width in diameter of each of the dummy pad DP and the connection pad P is set to be larger than the width of the dummy wiring portion DW. Also, the maximum width in diameter of the dummy pad DP is set to be smaller than or equal to the maximum width in diameter of the connection pad P.

The dummy wiring portion DW and the dummy pad DP of the second wiring layer 22 do not function as a wiring of an electric circuit, but are electrically connected to the wiring portion W.

As will be mentioned layer, a bump of an electronic component is arranged on the connection pad P of the second wiring layer 22 through a resin-containing solder. At this time, a solder which is aggregated on the bump of the electronic component and the connection pad P of the wiring substrate 1 is made to flow toward the dummy pad DP side, thereby the volume of the solder aggregated on the bump of the electronic component is adjusted.

The solder has the property that tries to round by the surface tension. For this reason, it is preferable from such a viewpoint that the amount of the solder can be easily controlled by employing a circular shape as the shape of each of the connection pad P and the dummy pad DP.

Alternatively, instead of a circular shape, a polygonal shape such as a triangular shape, a quadrangular shape, or a hexagonal shape may be employed as the shape of each of the connection pad P and the dummy pad DP.

Moreover, the four second wiring layers 22 arranged in the four corner regions of the chip mounting region are each formed of a connection pad P connected to a via conductor in a via hole located to a lower side, a dummy wiring portion DW linked to the connection pad P and extending toward the outer side, and a dummy pad DP linked to the dummy wiring portion DW.

Moreover, in a center part of the chip mounting region, dummy wiring layers DL are arranged which are formed to be separated from the wiring portions W and the dummy portions D on the peripheral sides. The dummy wiring layers DL are formed from the same layer as the wiring portions W and the dummy portions D, and the second wiring layers 22 are formed to include the dummy wiring layers DL.

The dummy wiring layer DL is not particularly limited in terms of the shape. For example, the dummy wiring layer DL is formed of a dummy pad DPx arranged at the center in the longitudinal direction and dummy wiring portions DWx extending from both sides of the dummy pad DPx. The diameter of the dummy pad DPx is set to be larger than the width of the dummy wiring portions DWx. The dummy wiring layer DL is not electrically connected to any wiring which constitutes the electric circuit, and is arranged as a floating electrode.

Alternatively, as the dummy wiring layer DL, such a structure may be employed that another dummy pad is formed to link to one terminal or both terminals of the dummy wiring portions DWx on the both sides of the dummy pad DPx.

The dummy wiring layer DL may be arranged with the same pattern as the connection pad P, the dummy wiring portion DW, and the dummy pad DP.

As depicted in the plan view in FIG. 3, a dashed circle is drawn in each of the connection pads P of the second wiring layers 22. This means that the bump of the electronic component is to be arranged on each connection pad P in which the dashed circle is drawn, as will be mentioned later.

No bump of the electronic component is to be arranged on the dummy pads DP, DPx in which the dashed circle is not drawn.

Note that the rigid-type wiring substrate 1 including the core substrate 10 is presented as an example, and a coreless wiring substrate including no core substrate may be used instead. The coreless wiring substrate is manufactured by forming required build-up wiring layers on a temporary substrate and subsequently removing the temporary substrate. Then, the uppermost wiring layers on the coreless wiring substrate are formed similarly to the second wiring layers 22 of the wiring substrate 1 mentioned above.

Next, a method of flip-chip connecting the electronic component to the wiring substrate 1 of the embodiment mentioned above will be explained. In the following, as depicted in FIG. 4A, the explanation will be given with reference to partially-enlarged cross-sectional views in which the second wiring layers 22 of the wiring substrate 1 in FIG. 2 and FIG. 3 and the periphery regions thereof are enlarged.

Figure 4A:
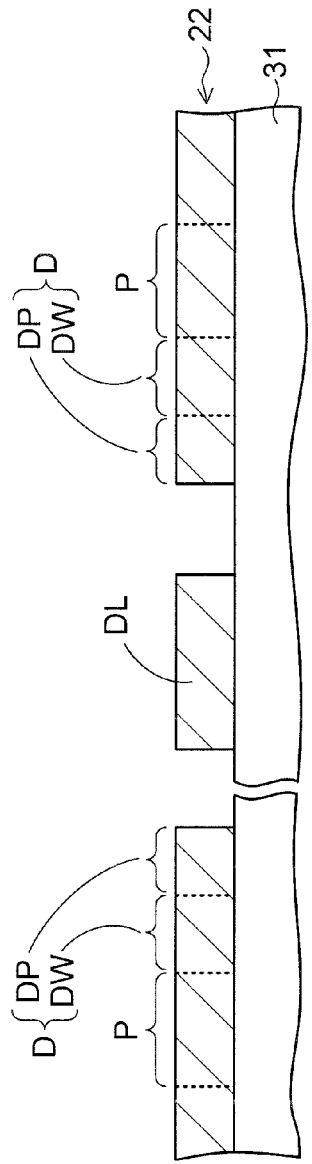
FIGS. 4A and 4B are cross-sectional views depicting a method in which an electronic component is flip-chip connected to the wiring substrate in FIG. 2 through a resin-containing solder (part 1).

In FIG. 4A, the second wiring layers 22 on both sides of the chip mounting region in FIG. 3 and one dummy wiring layer DL between the second wiring layers 22 are drawn, and FIG. 4A is the partially-enlarged cross-sectional view combining a cross section taken along line II-II in FIG. 3 and a cross section taken along line III-III in FIG. 3.

In FIG. 4A, the connection pads P, the dummy wiring portions DW and the dummy pads DP linked to the connection pads P, and the dummy wiring layer DL, out of the second wiring layer 22, are drawn.

Figure 4B:
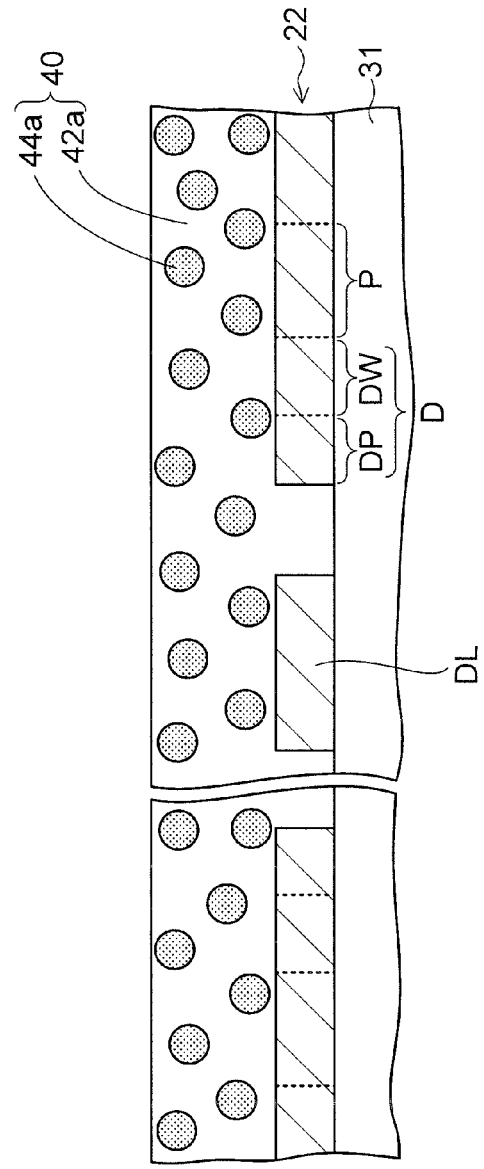

First, as depicted in FIG. 4B, liquid resin-containing solder 40 is formed on the insulating layer 31 of the wiring substrate 1 in FIG. 4A so as to cover the second wiring layers 22. The resin-containing solder 40 is coated by means of a dispenser, screen printing, or the like on the chip mounting region in the opening portion 32a opened collectively of the solder resist layer 32 in FIG. 2 and FIG. 3 or on a region including the chip mounting region.

The resin-containing solder 40 is formed by dispersing many solder particles 44a in thermosetting epoxy resin 42a. The solder particles 44a are formed of a low-melting-point solder material that reflows at 150° C., which is the cure temperature of the epoxy resin 42a.

As a preferable solder material for the solder particles 44a, tin (Sn).Bismuth (Bi)-based solder whose melting point is 137° C. is used. Alternatively, tin (Sn).indium (In)-based solder may be used. Still alternatively, gallium (Ga)-based solder, or tin (Sn).silver (Ag)-based solder may be used.

The thickness of the resin-containing solder 40 is adjusted so as to correspond to the height of the bumps of the electronic component. For example, the thickness of the resin-containing solder 40 is 20 μm to 50 μm and preferably about 30 μm. Also, the diameter of the solder particles 44a is for example about 10 μm to 20 μm.

Figure 5:
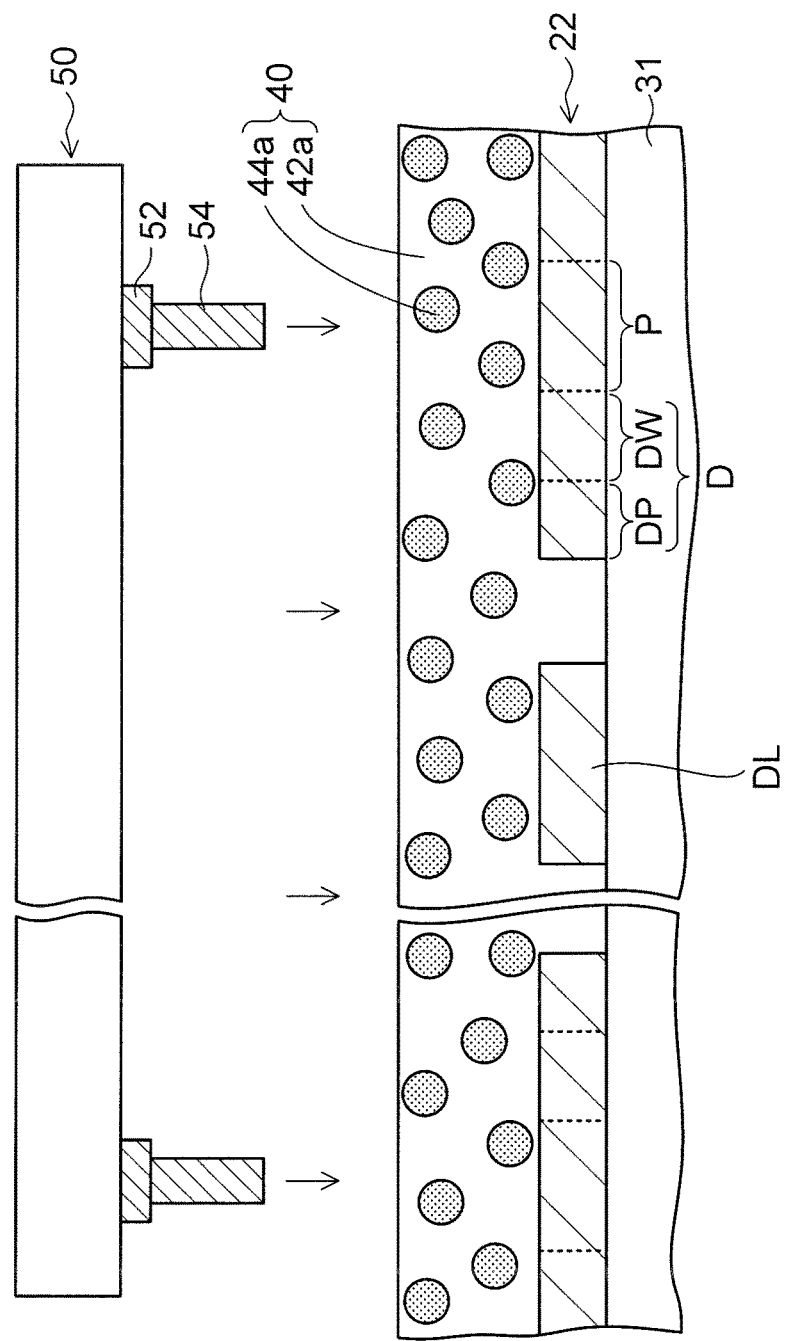
FIG. 5 is a cross-sectional view depicting the method in which the electronic component is flip-chip connected to the wiring substrate in FIG. 2 through the resin-containing solder (part 2).

Then, as depicted in FIG. 5, an electronic component 50 is prepared. The electronic component 50 includes electrodes 52 formed of aluminum (Al) or the like and gold (Au) bumps 54 connected to the electrodes 52. The gold bumps 54 are formed by a wire bonding method.

The gold bumps 54 are presented as a preferable example of the metal bumps of the electronic component 50. Copper (Cu) bumps formed by the wire bonding method may instead be used. Alternatively, copper (Cu) bumps formed by plating or vapor deposition method may be used.

Note that, in the case of producing electronic component devices in small quantity, such a method is often employed that the electronic component 50 which is individuated in the chip form, but is not a wafer, is supplied, and the bumps are formed on the electronic component 50. The method in which the bumps are formed by the plating on the electronic component 50 in the chip form, or the solder balls are mounted thereon increases the cost, therefore it is hard to employ.

In this embodiment, the wire bonding method is employed, thereby the metal bumps can be easily formed at low cost even if the electronic component 50 is in the chip form.

As the electronic component 50, a MEMS chip such as an acceleration sensor or a pressure sensor, a semiconductor chip such as a CPU chip or a memory chip, or the like is used, for example. In the case of using the MEMS chip, a driver IC is mounted with it. Also, in the case of using the semiconductor chip, a passive element such as a capacitor may be mounted with it.

Figure 6:
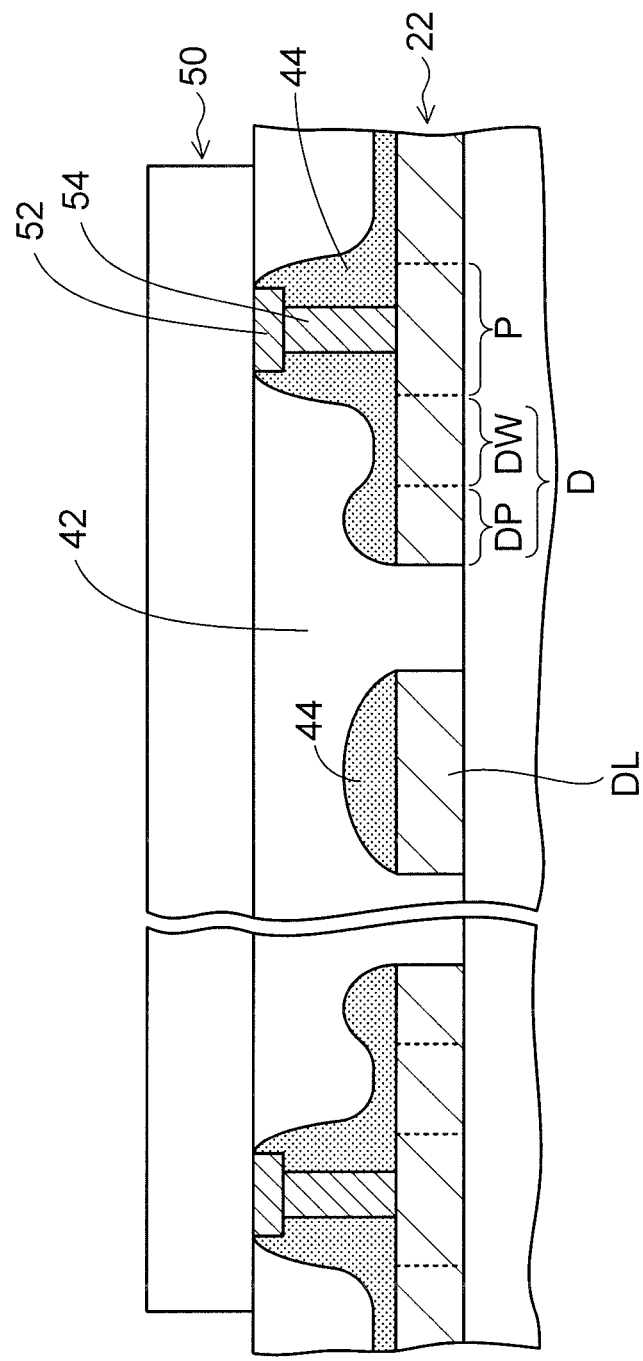
FIG. 6 is a cross-sectional view depicting the method in which the electronic component is flip-chip connected to the wiring substrate in FIG. 2 through the resin-containing solder (part 3).

Thereafter, as depicted in FIG. 5 and FIG. 6, the gold bumps 54 of the electronic component 50 are pushed into the resin-containing solder 40, thereby the gold bumps 54 are arranged on the connection pads P of the wiring substrate 1.

At this time, simultaneously, the wiring substrate 1, the resin-containing solder 40, and the electronic component 50 are heated at a temperature of about 150° C. By this matter, as depicted in FIG. 6, with fluidization of the epoxy resin 42a of the resin-containing solder 40, the solder particles 44a are aggregated on outer faces of the electrodes 52 and the gold bumps 54 of the electronic component 50 and on the second wiring layers 22 of the wiring substrate 1, thereby a solder 44 is formed.

Also at the same time, the solder particles 44a are similarly aggregated on the dummy wiring layers DL in the center part of the wiring substrate 1 as well, thereby the solder 44 is formed.

In this embodiment, the dummy wiring layers DL are arranged at the space region in the center part of the wiring substrate 1. For this reason, the solder particles 44a in the resin-containing solder 40 in the center part of the wiring substrate 1 do not lose a place to go, and are aggregated on the dummy wiring layers DL. Therefore, it is prevented that the solder is linked between the gold bumps 54 of the electronic component 50 and an electrical short circuit occurs.

Further, in the second wiring layers 22 of the wiring substrate 1, the dummy wiring portions DW and the dummy pads DP are linked to the connection pads P. Therefore, the solder 44 formed on the gold bumps 54 of the electronic component 50 flows toward the dummy pads DP side. By this matter, it is prevented that excess solder 44 is formed on the gold bumps 54 of the electronic component 50.

As a result, it is prevented that the solder is linked between the gold bumps 54 of the electronic component 50. Therefore, even if the gold bumps 54 of the electronic component 50 are arranged at a narrow pitch, the occurrence of an electrical short circuit is prevented.

Also, in the dummy portion D of each second wiring layer 22 of the wiring substrate 1, the diameter of the dummy pad DP is set to be larger than the width of the dummy wiring portion DW. Hence, the volume of the solder 44 on the dummy pad DP is larger than the volume of the solder 44 on the dummy wiring portion DW.

In this way, by linking the dummy wiring portion DW and the dummy pad DP to the connection pad P of the second wiring layer 22 of the wiring substrate 1, the volume of the solder 44 formed on the gold bump 54 of the electronic component 50 can be controlled to a constant volume. By increasing the diameter of the dummy pad DP, the volume of the solder 44 left on the gold bump 54 of the electronic component 50 can be reduced.

But, when the diameter of the dummy pad DP is larger than the diameter of the connection pad P, the interval between the adjacent dummy pads DP is made narrow, therefore there is fear that an electrical short circuit occurs between the dummy pads DP.

In view of this, in this embodiment, the diameter of the dummy pad DP is set to be smaller than or equal to the diameter of the connection pad P.

Further, by linking the dummy wiring portion DW and the dummy pad DP to the connection pad P of the second wiring layer 22 of the wiring substrate 1, it is possible to reduce variation in volume of the solder 44 finally left on the plurality of gold bumps 54 of the electronic component 50.

Unlike this embodiment, in the case that the dummy wiring portion DW and the dummy pad DP are not linked to the connection pad P, the solder 44 formed on the gold bump 54 of the electronic component 50 cannot flow to the periphery from the gold bump 54.

For this reason, the solder 44 is left excessively on the gold bump 54 of the electronic component 50. Particularly, the solder 44 concentrates on the gold bumps 54 located in the four corners, thus an electrical short circuit is easy to occur between the gold bumps 54.

Figure 7:
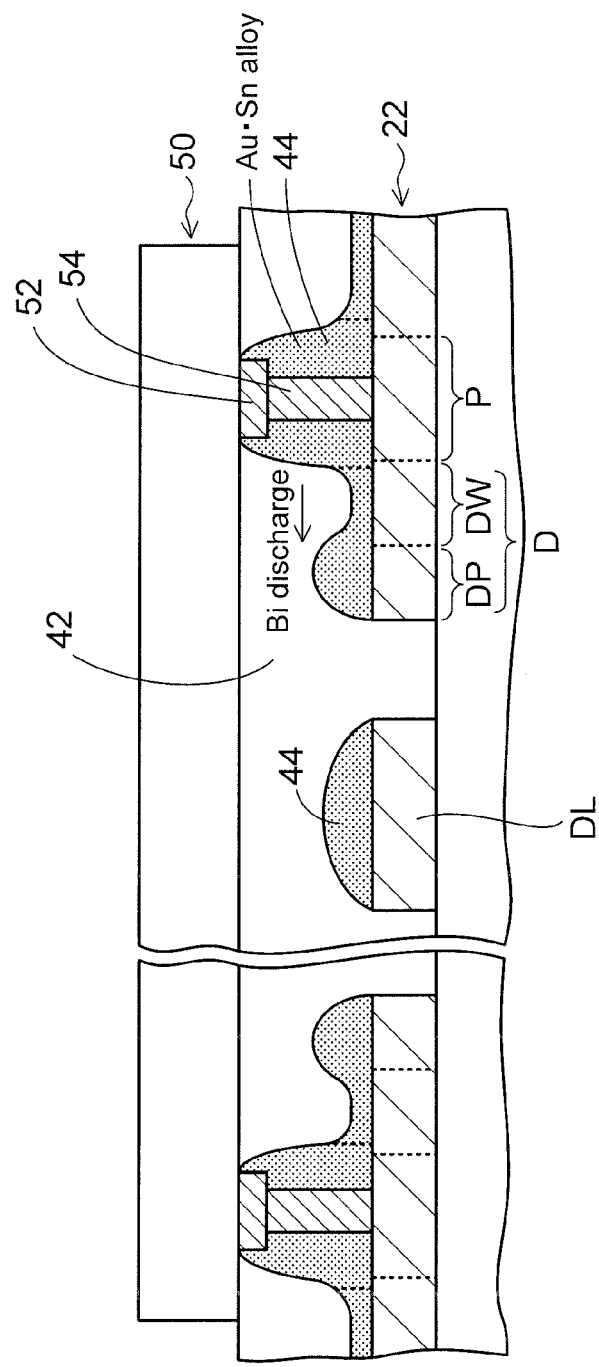
FIG. 7 is a cross-sectional view depicting the method in which the electronic component is flip-chip connected to the wiring substrate in FIG. 2 through the resin-containing solder (part 4).
Figure 8:
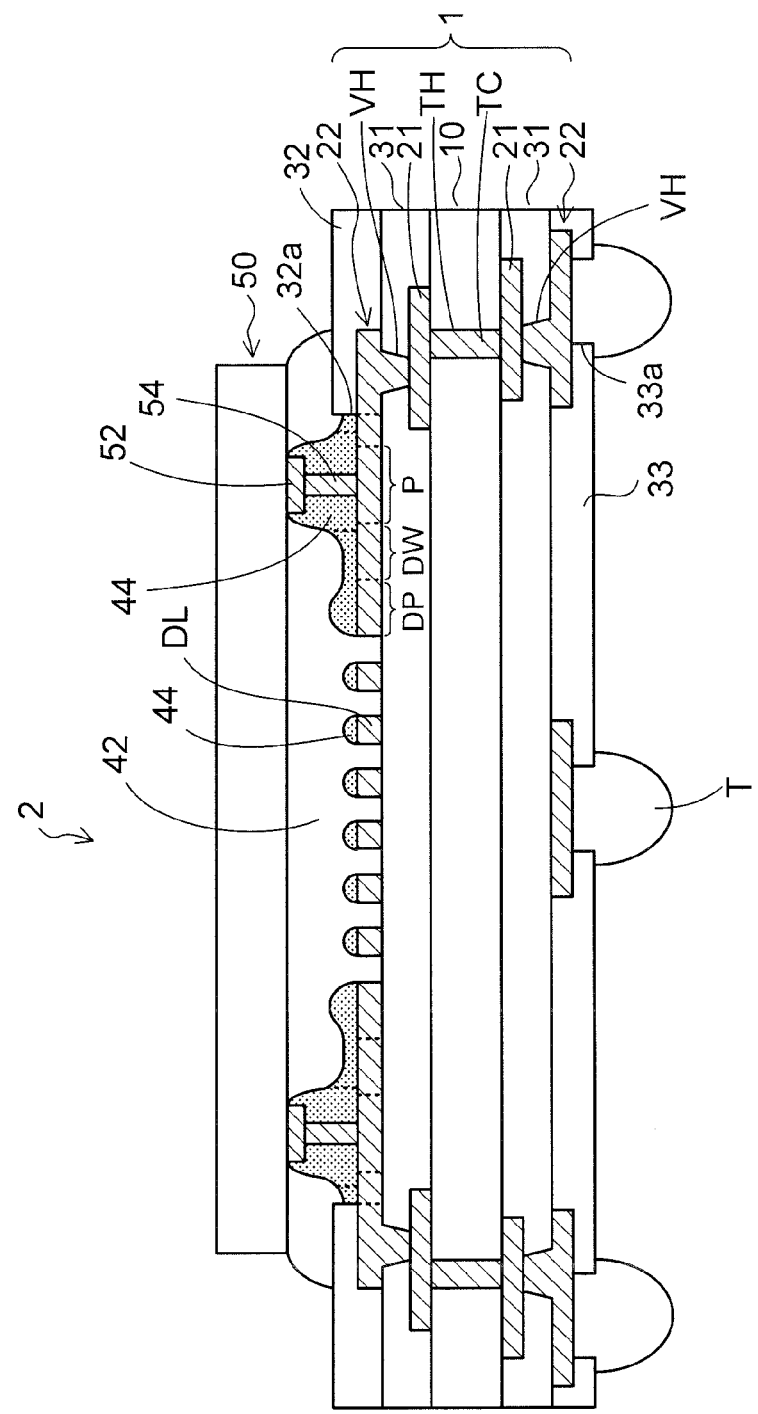
FIG. 8 is a cross-sectional view depicting an electronic component device of the embodiment.

Then, as depicted in FIG. 7, the structure in FIG. 6 is heated at a temperature of 200° C. for 30 minutes. At this time, in the case that the solder 44 is made of tin (Sn).Bismuth (Bi)-based solder, Bi is discharged from the periphery of the gold bump 54 of the electronic component 50 toward the dummy pad DP side.

Simultaneously, all unreacted tin in the solder 44 formed in the periphery of the gold bump 54 of the electronic component 50 reacts with the gold bump 54, thereby it becomes a Au.Sn alloy. By this matter, the unreacted tin disappears in the periphery of the gold bump 54 of the electronic component 50.

In the case that the unreacted tin remains in the periphery of the gold bump 54 of the electronic component 50, when the product is actually used, such a problem occurs that the gold bump 54 is eroded by the unreacted tin in the solder thereby the void is generated in the periphery of the gold bump 54, or the gold bump 54 disappears.

In this embodiment, for the above reason, by performing the heat process excessively, such an effect can be obtained that the unreacted tin does not remain in the periphery of the gold bump 54 of the electronic component 50, thereby the erosion of the gold bump 54 is prevented when the product is used.

In the above manner, the gold bumps 54 of the electronic component 50 are flip-chip connected to the connection pads P of the wiring substrate 1 by the solder 44. Then, when the heat process is performed to the resin-containing solder 40 and the solder particles 44a are aggregated, mentioned above, the epoxy resin 42a of the resin-containing solder 40 is simultaneously cured. By this matter, sealing resin 42 is formed between the wiring substrate 1 and the electronic component 50.

FIG. 8 depicts the entire state of the wiring substrate 1 including the structure in FIG. 7 mentioned above. As depicted in FIG. 8, external connection terminals T are further formed on the connection parts of the second wiring layers 22 on the lower face side of the wiring substrate 1 by for example mounting solder balls. In the case of using a large-size substrate in which a plurality of chip mounting regions are defined, the large-size substrate is cut, and individual wiring substrates 1 are obtained.

By the above step, as depicted in FIG. 8, an electronic component device 2 of the embodiment is obtained. In the electronic component device 2 of the embodiment, the gold bumps 54 of the electronic component 50 are flip-chip connected to the connection pads P of the wiring substrate 1 explained in FIG. 2 and FIG. 3 mentioned above by the solder 44.

The solder 44 is formed on each of the gold bump 54 of the electronic component 50, and the connection pad P, the dummy wiring portion DW and the dummy pad DP of the wiring substrate 1. Further, the sealing resin 42 is filled between the electronic component 50 and the wiring substrate 1.

As mentioned above, the solder 44 formed in the periphery of the gold bump 54 of the electronic component 50 is formed by the aggregation of the solder particles 44*a* in the resin-containing solder 40. The dummy wiring portion DW and the dummy pad DP are linked to the connection pad P of the wiring substrate 1.

For this reason, the excess solder formed on the gold bump 54 of the electronic component 50 flows onto the dummy pad DP. As a result, the solder 44 is formed evenly between the plurality of gold bumps 54 of the electronic component 50, thereby the occurrence of an electrical short circuit between the gold bumps 54 is prevented.

Also, the diameter of the dummy pad DP is set to be larger than the width of the dummy wiring portion DW. Therefore, the volume of the solder 44 on the dummy pad DP is larger than the volume of the solder 44 on the dummy wiring portion DW.

Also, in the case of using Sn.Bi-based solder as the solder 44, by performing the heat process excessively, Bi is discharged toward the dummy pad DP side, and all Sn can be alloyed with the gold bump 54 of the electronic component 50.

By this matter, when the electronic component device 2 is actually used, since the unreacted tin does not remain in the periphery of the gold bump 54 of the electronic component 50, the erosion of the gold bump 54 of the electronic component 50 can be prevented.

As a result, the contact resistance of connection parts between the electronic component 50 and the wiring substrate 1 can be reduced, and the reliability of connection can be ensured. Further, the tolerability to electromigration at the connection parts between the electronic component 50 and the wiring substrate 1 can be improved.

Also, by employing the method of flip-chip connecting the electronic component 50 to the wiring substrate 1 through the resin-containing solder 40, the electronic component device can be manufactured at a lower cost and with a short lead time than when the solder is formed by printing or the like.

Accordingly, especially in the case of small quantity production, the manufacturing cost can be reduced and the delivery time can be shortened.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

Further, the clauses are disclosed about the above embodiment hereinafter.

(Clause 1) A method of manufacturing an electronic component device, comprising:

preparing a wiring substrate including a connection pad, a dummy wiring portion linked to the connection pad, and a dummy pad linked to the dummy wiring portion, as an outermost wiring layer in an upper face of the wiring substrate;

forming a resin-containing solder including solder particles on the wiring substrate; and arranging a bump of an electronic component on the connection pad of the wiring substrate by pushing the bump of the electronic component into the resin-containing solder, and aggregating the solder particles on each of the bump of the electronic component, the connection pad, the dummy wiring portion, and the dummy pad by a heat process, thereby forming a solder, wherein, a maximum width of each of the connection pad and the dummy pad is set to be larger than a width of the dummy wiring portion, and in the forming of the solder, the solder aggregated on the connection pad and the bump of the electronic component is made to flow toward the dummy pad side through the dummy wiring portion, thereby a volume of the solder formed on the bump of the electronic component is adjusted.

What is claimed is:

1. A wiring substrate, comprising:
    a connection pad formed in an outermost wiring layer;
    a dummy pad formed in the outermost wiring layer; and
    a dummy wiring portion formed in the outermost wiring layer, the dummy wiring portion connecting the connection pad and the dummy pad,
    wherein, the connection pad, the dummy pad and the dummy wiring portion have a side surface respectively, one end of the dummy wiring portion is connected to the side surface of the connection pad, the other end of the dummy wiring portion is the side surface of the dummy pad, and
    a maximum width of each of the connection pad and the dummy pad is larger than a width of the dummy wiring portion.

2. The wiring substrate according to claim 1, wherein the maximum width of the dummy pad is smaller than or equal to the maximum width of the connection pad.

3. The wiring substrate according to claim 1, wherein the dummy pad is in a circular shape.

4. The wiring substrate according to claim 1, wherein the connection pad, the dummy pad and the dummy wiring portion are formed on an insulating layer, the each side surface of the connection pad, the dummy pad and the dummy wiring portion is exposed from the insulating layer.

5. An electronic component device, comprising:
    a wiring substrate including
        a connection pad formed in an outermost wiring layer,
        a dummy pad formed in the outermost wiring layer, and
        a dummy wiring portion formed in the outermost wiring layer, the dummy wiring portion connecting the connection pad and the dummy pad;
    an electronic component including a bump flip-chip connected to the connection pad of the wiring substrate;
    a solder formed on the bump of the electronic component, the connection pad, the dummy wiring portion and the dummy pad of the wiring substrate; and a sealing resin filled between the electronic component and the wiring substrate, wherein, a maximum width of the dummy pad is set to be larger than a width of the dummy wiring portion, and a volume of the solder on the dummy pad is larger than a volume of the solder on the dummy wiring portion.

* * * * *